(12) United States Patent
Morales

(10) Patent No.: US 7,716,939 B1
(45) Date of Patent: May 18, 2010

(54) METHOD AND APPARATUS FOR COOLING ELECTRONIC COMPONENTS

(75) Inventor: Osvaldo Patricio Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 277 days.

(21) Appl. No.: 11/535,180

(22) Filed: Sep. 26, 2006

(51) Int. Cl.
F25D 23/12 (2006.01)
H05K 7/20 (2006.01)

(52) U.S. Cl. .................. 62/259.2; 361/688; 361/690

(58) Field of Classification Search ......... 700/299–300, 700/282, 165, 301, 1–89; 62/259.2, 178, 62/186; 236/49.3; 361/696; 454/245
See application file for complete search history.

(56) References Cited

U.S. PATENT DOCUMENTS

| | | | |
|---|---|---|---|
| 3,930,611 A * | 1/1976 | Demaray | 236/1 B |
| 5,540,619 A | 7/1996 | Ahmed | |
| 5,651,264 A | 7/1997 | Lo et al. | |
| 5,810,657 A | 9/1998 | Pariseau | |
| 5,951,394 A | 9/1999 | Pariseau | |
| 5,963,458 A | 10/1999 | Cascia | |
| 6,227,961 B1 | 5/2001 | Moore et al. | |
| 6,718,277 B2 | 4/2004 | Sharma | |
| 6,772,604 B2 * | 8/2004 | Bash et al. | 62/259.2 |
| 6,775,997 B2 | 8/2004 | Bash et al. | |
| 6,832,489 B2 | 12/2004 | Bash et al. | |
| 6,832,490 B2 | 12/2004 | Bash et al. | |
| 6,834,512 B2 | 12/2004 | Bash et al. | |
| 6,854,284 B2 | 2/2005 | Bash et al. | |
| 6,868,683 B2 | 3/2005 | Bash et al. | |
| 6,945,058 B2 | 9/2005 | Bash et al. | |
| 6,981,915 B2 | 1/2006 | Moore et al. | |
| 2004/0217072 A1 | 11/2004 | Bash et al. | |
| 2004/0218355 A1 | 11/2004 | Bash et al. | |
| 2005/0159099 A1 | 7/2005 | Malone | |
| 2005/0225936 A1 | 10/2005 | Day | |
| 2005/0237716 A1 | 10/2005 | Chu et al. | |
| 2006/0091229 A1 | 5/2006 | Bash et al. | |

* cited by examiner

Primary Examiner—Chen-Wen Jiang
(74) Attorney, Agent, or Firm—Armstrong Teasdale LLP

(57) ABSTRACT

A method of cooling at least one electronic component that is configured to generate a predetermined waste heat includes providing a first fluid channeling sub-system that has a first fluid source and at least one controller. The method also includes channeling at least a portion of the first fluid towards the electronic component. The method further includes configuring the at least one controller to facilitate substantially maintaining at least a portion of the first fluid channeling sub-system at a predetermined pressure.

24 Claims, 2 Drawing Sheets

METHOD AND APPARATUS FOR COOLING ELECTRONIC COMPONENTS

BACKGROUND OF THE INVENTION

The present invention relates generally to cooling systems and more particularly, to methods and apparatus for cooling electronic components.

Some known electronic components generate waste heat energy when energized and this heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

BRIEF DESCRIPTION OF THE INVENTION

In one aspect, a method of cooling at least one electronic component that is configured to generate a predetermined waste heat is provided. The method includes providing a first fluid channeling sub-system that has a first fluid source and at least one controller. The method also includes channeling at least a portion of the first fluid towards the electronic component. The method further includes configuring the at least one controller to facilitate substantially maintaining at least a portion of the first fluid channeling sub-system at a predetermined pressure.

In another aspect, a cooling system is provided. The cooling system includes a first fluid channeling sub-system and a second fluid channeling sub-system. The second fluid channeling sub-system is coupled in heat transfer communication with the first fluid channeling sub-system. The second fluid channeling sub-system is configured to remove heat from a first fluid. The cooling system also includes at least one pressure sensor coupled in flow communication with at least a portion of at least one of the first fluid and a second fluid. The cooling system further includes at least one controller coupled in electronic data communication with the at least one pressure sensor. The at least one controller is configured to control a predetermined differential temperature across at least a portion of the first fluid channeling sub-system by controlling a temperature of at least a portion of the second fluid based on an output of said at least one pressure sensor.

In a further aspect, a data center is provided. The data center includes at least one equipment enclosure partially defined by at least one wall, one ceiling and one floor. The data center also includes at least one electronic component rack positioned within the at least one equipment enclosure. The data center further includes at least one cooling system coupled in flow communication with the at least one equipment enclosure. The at least one cooling system includes a first fluid channeling sub-system and a second fluid channeling sub-system coupled in heat transfer communication with the first fluid channeling sub-system. The cooling system also includes at least one pressure sensor coupled in flow communication with at least a portion of at least one of a first fluid and a second fluid. The cooling system further includes at least one controller coupled in electronic data communication with the at least one pressure sensor The first fluid is in flow communication with the at least one electronic component rack. The second fluid channeling sub-system is configured to remove heat from the first fluid. The at least one controller is configured to control a predetermined differential temperature across at least a portion of the first fluid channeling sub-system by controlling a temperature of at least a portion of the second fluid based on an output of said at least one pressure sensor.

DETAILED DESCRIPTION OF THE INVENTION

Figure 1:
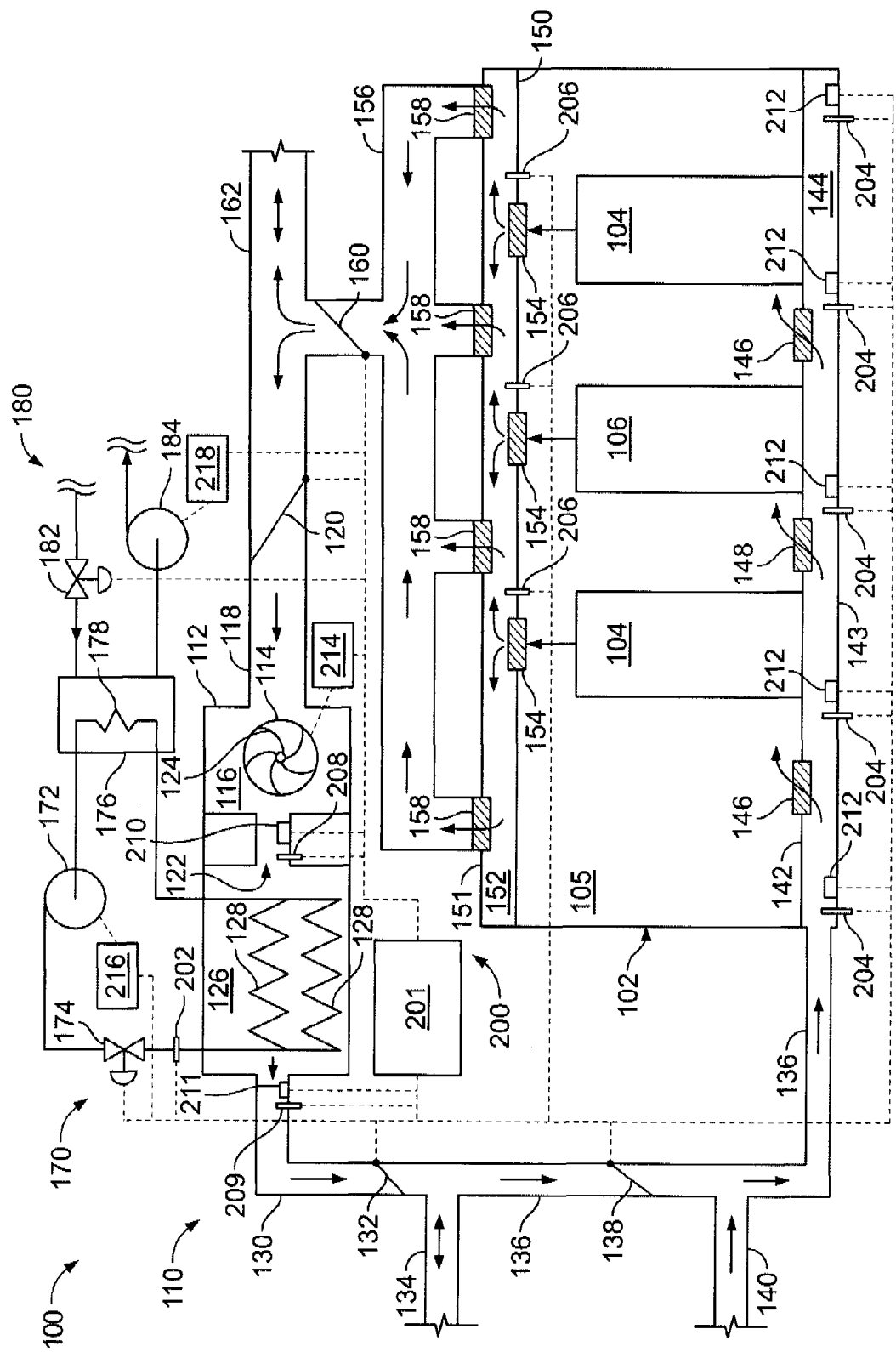
FIG. 1 is a schematic view of an exemplary data center cooling system.

FIG. 1 is a schematic view of an exemplary data center cooling system 100. System 100 is configured to remove waste heat generation from a data center 102. Data center 102 includes at least one high-density equipment rack system, or high-density rack 104, and at least one low-density equipment rack system, or low-density rack 106. Racks 104 and 106 are substantially similar with the exception of a configuration of electronic components (not shown) within each of racks 104 and 106 and the associated waste heat generation. Typically, waste heat generation from high-density rack 104 is greater than waste heat generation from low-density rack 106 due to the greater concentration of waste heat sources within rack 104 as compared to rack 106. Racks 104 and 106 are positioned within a room 105 of data center 102.

System 100 includes a fluid transport sub-system that, in the exemplary embodiment, is an air handling sub-system 110. Sub-system 110 is coupled in flow communication with data center 102 and includes at least one air handler 112. In the exemplary embodiment, sub-system 110 is configured to channel approximately 1,332 cubic meters of air per minute (m³/min) (approximately 47,000 cubic feet per minute (ft³/min). Air handler 112 includes at least one air pump, or fan 114 and a fan compartment 116 wherein fan 114 is positioned within compartment 116. Compartment 116 is coupled in flow communication with at least one air handler suction duct 118. Duct 118 includes at least one isolation damper 120 that is configured to isolate air handler 112 from the remainder of sub-system 110 in the event that such isolation is needed for situations that include, but are not, limited to, maintenance activities. Fan 114 includes a volute 122 and a plurality of fan blades 124 wherein volute 122 is configured to receive air discharged from blades 124. Air handler 112 also includes at least one heat exchange compartment 126 wherein a plurality of heat transfer conduits, or tubes 128, are positioned within. Compartment 126 is coupled in flow communication with compartment 116 such that air discharged from fan 114 is channeled across tubes 128. Tubes 128 are configured to facilitate heat removal from air channeled through compartment 126.

Air handling sub-system 110 also includes an air handler air discharge duct 130 that is coupled in flow communication with air handler 112. Duct 130 includes at least one air handler discharge duct damper 132 that is substantially similar to damper 120 in construction and purpose. Duct 130 is coupled in flow communication with at least one cross-over duct 134 that is further coupled in flow communication with other data centers (not shown) similar to data center 102 and/or other air handling sub-systems (not shown) similar to sub-system 110. Sub-system 110 further includes at least one data center supply duct 136 that is coupled n flow communication with ducts 130 and 134 as well as data center 102. Duct 134 includes at least one damper 138 that is configured to isolate data center 102 from sub-system 110. Duct 136 is also coupled in flow communication with at least one outside air supply duct 140 that is configured to channel outside air into duct 136. In the exemplary embodiment, duct 140 is coupled in flow communication to an air handler (not shown) that is similar to air handler 112.

Data center 102 further includes a raised floor 142 that at least partially forms room 105. Data center 102 also includes a lower floor 143 that cooperates with floor 142 to at least partially form a data center air supply plenum 144. Floor 142 is configured to support data center components that are positioned within room 105 that include, but are not limited to, racks 104 and 106. At least one high-density air flow restriction device 146 is positioned within floor 142 and is configured such that a first predetermined rate of air flow at a first predetermined velocity is facilitated to impinge on each of racks 104. Similarly, at least one low-density air flow restriction device 148 is positioned within floor 142 and is configured such that a second predetermined rate of air flow at a second predetermined velocity is facilitated to impinge on each of racks 106. Devices 146 and 148 facilitate coupling plenum 144 in flow communication with room 105. In the exemplary embodiment, devices 146 and 148 are gratings fabricated to facilitate attaining the associated predetermined air flows and velocities. Alternatively, devices 146 and 148 are any devices that facilitate operation of system 100 as described herein, including, but not limited to, perforated floor tiles wherein such perforations are dimensioned and positioned to attain the associated predetermined air flows and velocities. Also, in the exemplary embodiment, racks 104 and 106 are configured to facilitate channeling heat-removing air flow into and throughout racks 104 and 106 from devices 146 and 148, respectively. Air flow is channeled such that substantially all of the waste heat generated by racks 104 and 106 is channeled out of racks 104 and 106 through the associated tops of racks 104 and 106.

Data center 102 also includes a drop ceiling 150 that at least partially forms room 105. Data center 102 further includes an upper ceiling 151 that cooperates with drop ceiling 150 to at least partially form a data center overhead air discharge plenum 152. A plurality of overhead air flow restriction devices 154 are positioned within ceiling 150 over racks 104 and 106, respectively. In the exemplary embodiment, the overhead devices are ceiling vents 154. Vents 154 facilitate coupling room 105 in flow communication with plenum 152 and each of vents 154 are substantially similar and are configured to channel substantially the same air flow. Alternatively, each of vents 154 are permanently configured to channel differing warm air flows in a manner similar to configuring devices 146 and 148 as described above. Further, alternatively, each of vents 154 are configured to be manually or automatically adjusted to vary air flow.

Sub-system 110 also includes a data center discharge duct 156 coupled in flow communication with plenum 152 via a plurality of air flow restriction devices 158. Devices 158, in the exemplary embodiment, are substantially similar to vents 154. Alternatively, each of devices 158 are permanently configured to channel differing warm air flows in a manner similar to configuring devices 146 and 148 as described above. Further, alternatively, each of devices 158 are configured to be manually or automatically adjusted to vary air flow. Duct 156 includes at least one isolation damper 160 that is similar to damper 138 in configuration and purpose. Duct 156 is coupled in flow communication to duct 118 and to at least one cross-over duct 162 that is coupled in flow communication with other data centers (not shown) similar to data center 102 and/or other air handling sub-systems (not shown) similar to sub-system 110.

Data center cooling system also includes a chilled water sub-system 170 coupled in heat transfer communication with sub-system 110. Sub-system 170 includes at least one pump 172 coupled in flow communication with a flow control valve 174. Valve 174 is coupled in flow communication with tubes 128 such that chilled water flow through tubes 128 is facilitated while air flows across tubes 128. Tubes 128 are coupled in flow communication with at least one chilled water heat exchanger 176 via a plurality of tubes 178 that are coupled in flow communication with pump 172.

Data center cooling system 100 further includes a chilled water heat removal sub-system 180. In the exemplary embodiment, sub-system 180 is a service water sub-system 180 that includes, but is not limited to, a flow control valve 182 coupled in flow communication with at least one pump 184 via heat exchanger 176. Alternatively, sub-system 180 may be any sub-system that facilitates operation of system 100 that includes, but is not limited to, an air-conditioning refrigerant sub-system and a cooling tower sub-system (neither shown). Sub-system 180 is coupled in heat transfer communication with sub-system 170 via heat exchanger 176 wherein service water flows over the outside of tubes 178 while chilled water flows within tubes 178. Alternatively, the fluid associated with sub-system 180 flows within tubes 178 while the fluid associated with sub-system 170 flows over the surface of tubes 178.

Data center cooling system 100 also includes a control sub-system 200. Sub-system 200 is configured to sense and measure a plurality of environmental parameters and modulate a differential temperature across each of racks 104 and 106.

As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits (neither shown in FIG. 1), and these terms are used interchangeably herein. In the exemplary embodiment, memory may include, but is not limited to, a computer-readable medium, such as a random access memory (RAM) (neither shown in FIG. 1). Alternatively, a floppy disk, a compact disc-read only memory (CD-ROM), a magneto-optical disk (MOD), and/or a digital versatile disc (DVD) (neither shown in FIG. 1) may also be used. Also, in the exemplary embodiment, additional input channels (not shown in FIG. 1) may be, but not be limited to, computer peripherals associated with an operator interface such as a mouse and a keyboard (neither shown in FIG. 1). Alternatively, other computer peripherals may also be used that may include, for example, but not be limited to, a scanner (not shown in FIG. 1). Furthermore, in the exemplary embodiment, additional output channels may include, but not be limited to, an operator interface monitor and/or a printer (neither shown in FIG. 1).

Processors (not shown) for sub-system 200, process information, including input environment measurement data. RAM and storage devices store and transfer information and instructions to be executed by the processor. RAM and storage devices can also be used to store and provide temporary variables, static (i.e., non-changing) information and instructions, or other intermediate information to the processors during execution of instructions by the processors. Instructions that are executed include, but are not limited to, resident averaging and forecasting algorithms. The execution of sequences of instructions is not limited to any specific combination of hardware circuitry and software instructions.

Sub-system 200 includes at least one PLC 201. PLC 201 is configured to operate dampers 120, 132, 138, and 160. In the exemplary embodiment, PLC 201 opens and closes dampers 120, 132, 138, and 160 based upon command signals from an operator to channel air flow through data center 102 as necessary for the prevailing operational conditions. Open and close control signals and damper position feedback signals are illustrated with the associated dashed lines. Alternatively, PLC 201 modulates dampers 120, 132, 138, and 160 between fully open and fully closed positions to modulate air flow.

Sub-system 200 also includes a plurality of temperature measurement devices that, in the exemplary embodiment, are thermocouples. Alternatively, the temperature measurement devices include, but are not limited to, resistance temperature detectors (RTDs) and any device that facilitate operation of sub-system 200 as described herein. At least one chilled water thermocouple 202 is positioned within sub-system 170 to facilitated measuring a temperature of the chilled water upon discharge from heat exchanger 176. In the exemplary embodiment, such chilled water temperatures are controlled to approximately 5.6 degrees Celsius (° C.) (42 degrees Fahrenheit (° F.)).

Sub-system 200 further includes at least one thermocouple 204 positioned within plenum 144 that is configured to facilitate measuring a temperature of air within plenum 144 prior to being channeled towards racks 104 and 106. In the exemplary embodiment, a plurality of thermocouples 204 are positioned approximately 3 meters (m) (10 feet (ft)) apart to facilitate measurement redundancy and measurement averaging across plenum 144. Alternatively, any number of thermocouples 206 positioned anywhere within plenum 144 that facilitates operation of system 100 as described herein is used.

Sub-system 200 also includes at least one thermocouple 206 positioned within plenum 152 that is configured to facilitate measuring a temperature of air within plenum 152 subsequent to being channeled from racks 104 and 106. In the exemplary embodiment, a plurality of thermocouples 206 are positioned approximately 3 meters (m) (10 feet (ft)) apart to facilitate redundancy and measurement averaging in a manner similar to that used with thermocouples 204 within plenum 144. Alternatively, any number of thermocouples 206 positioned anywhere within plenum 152 that facilitates operation of system 100 as described herein is used.

Sub-system 200 further includes at least one thermocouple 208 and pressure transmitter 210 positioned within fan volute 122 that are configured to facilitate measuring a temperature and a pressure, respectively, of air being discharged by fan 114. Moreover, sub-system 200 includes at least one thermocouple 209 and pressure transmitter 211 positioned within duct 130, as close to compartment 126 as practical, that are configured to facilitate measuring a temperature and a pressure, respectively, of air being discharged from compartment 126. Thermocouples 208 and 209 and pressure transmitters 210 and 211 are used to facilitate separating dynamic effects from static effects during tuning activities of sub-system 200 during commissioning, thereby facilitating tuning dynamic control responses out of sub-system 200.

Sub-system 200 also includes at least one pressure transmitter 212 positioned within plenum 144 that is configured to facilitate measuring a pressure of air within plenum 144 prior to being channeled towards racks 104 and 106. In the exemplary embodiment, a plurality of pressure transmitters 212 are positioned approximately 3 meters (m) (10 feet (ft)) apart to facilitate redundancy and measurement averaging in a manner similar to that used with thermocouples 204 within plenum 144. Alternatively, any number of pressure transmitters 212 positioned anywhere within plenum 144 that facilitates operation of system 100 as described herein is used.

Thermocouples 202, 204, 206 and 208 as well as pressure transmitters 210 and 212 are coupled in electronic data communication with PLC 201 as illustrated by the associated dashed lines in FIG. 1. Moreover, PLC 201 is configured to receive electronic data signals from such thermocouples 202 to 208 and transmitters 210 and 212.

Sub-system 200 further includes a variable frequency drive (VFD) 214 coupled in electronic data communication with PLC 201. VFD 214 is coupled to a prime mover (not shown) of fan 114. Moreover, VFD 214 is configured to receive control signals from PLC 201 and subsequently modulate a rotational velocity of blades 124 such that air flow through sub-system 110 is also modulated. As discussed above, in an alternative embodiment, dampers 120, 132, 138 and 160 may also be modulated via PLC 201 to modulate air flow through sub-system 110.

Sub-system 200 also includes a VFD 216 coupled to a prime mover (not shown) of pump 172. VFD 216 is coupled in electronic data communication with PLC 201 and is configured to receive control signals from PLC 201 and subsequently modulate a rotational velocity of pump 172 such that chilled water flow through sub-system 170 is modulated. In the exemplary embodiment, PLC 201 is also coupled in electronic data communication with valve 174 wherein valve 174 is configured to receive control signals from PLC 201 to modulate a position of valve 174 between fully open and fully closed positions wherein chilled water flow is modulated. Alternatively, only one of pump 172 or valve 174 are modulated via PLC 201.

Sub-system 200 further includes a VFD 218 coupled to a prime mover (not shown) of pump 184. VFD 218 is coupled in electronic data communication with PLC 201 and is configured to receive control signals from PLC 201 and subsequently modulate a rotational velocity of pump 184 such that service water flow through sub-system 180 is modulated. In the exemplary embodiment, PLC 201 is also coupled in electronic data communication with valve 182 wherein valve 182 is configured to receive control signals from PLC 201 to modulate a position of valve 182 between fully open and fully closed positions wherein service water flow is modulated. Alternatively, only one of pump 184 or valve 182 are modulated via PLC 201.

In the exemplary embodiment, VFDs 214, 216, and 218 use pulse width modulation (PWM) methods as are know in the art to modulate the rotational velocity of the associated prime movers. Alternatively, any method of modulation of fan 114 and pumps 172 and 184 that facilitates operation of system 100 as described herein is used. Furthermore, PLC 201 is configured with at least one algorithm to receive the aforementioned pressure and temperature measurement signals and modulate VFDs 214, 216 and 218 as well as valves 174 and 182 to maintain a predetermined differential temperature across racks 104 and 106.

Figure 2:
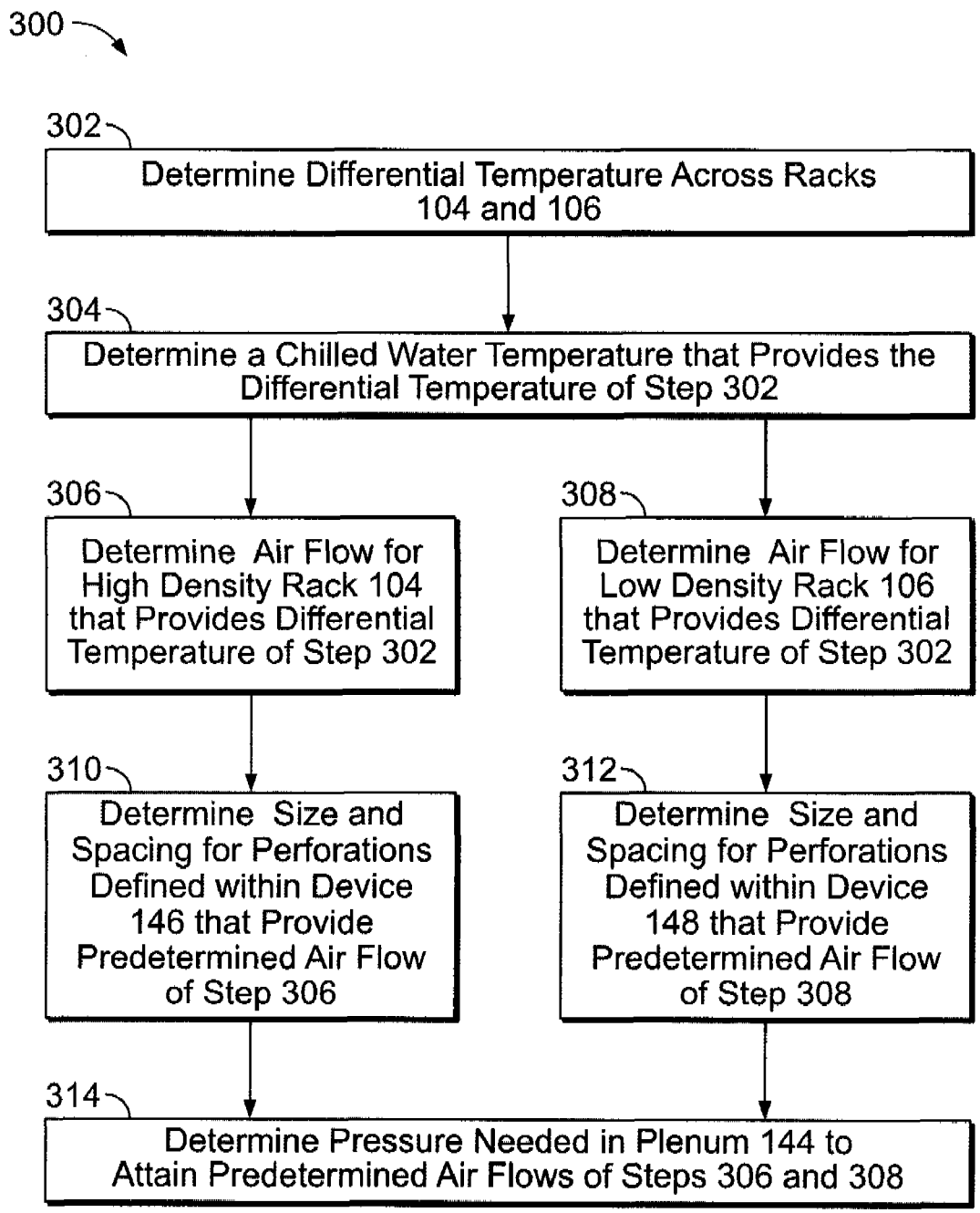
FIG. 2 is a block diagram of a method of determining at least one air flow that can be used with the data center cooling system shown in FIG. 1.

FIG. 2 is a block diagram of a method 300 of determining at least one air flow that can be used with data center cooling system 100 (shown in FIG. 1). Method 300 includes determining 302 a differential temperature that should be maintained across racks 104 and 106. Typically, such determinations use technical information that includes, but is not limited to, manufactures specifications and anticipated utilization of the equipment. In the exemplary embodiment, such predetermined differential temperatures are substantially similar for both racks 104 and 106. Alternatively, differing racks have differing predetermined differential temperatures. Moreover, in the exemplary embodiment, the predetermined differential temperatures across racks 104 and 106 is approximately 22° C. (40° F.). In operation, such differential temperatures are calculated based on temperatures sensed and measured using thermocouples 204 and 206.

Method 300 also includes determining 304 a chilled water temperature that provides the predetermined differential temperatures across racks 104 and 106. Determining 304 such chilled water temperatures is accomplished using heat transfer algorithms known in the art. In the exemplary embodiment, such temperature is approximately 5.6° C. (42° F.). In operation, such chilled water temperatures are sensed and measured using thermocouple 202.

Method 300 further includes determining 306 an air flow for rack 104 that provides the predetermined differential temperatures of step 302. Determining 306 the air flow is typically performed using heat transfer algorithms known in the art. In the exemplary embodiment, step 306 provides a predetermined air flow for rack 104 that is approximately 11.3 m$^3$/min (400 ft$^3$/min). Method 300 also includes determining 308 an air flow for rack 106 that is substantially similar to step 306. In the exemplary embodiment, step 308 provides a predetermined air flow for rack 106 that is approximately 22.6 m$^3$/min (800 ft$^3$/min).

Method 300 further includes determining 310 a size and spacing for perforations defined within device 146 that provide the predetermined air flow from step 306. Determining 310 the details of the perforations within 146 is typically performed using algorithms know in the art. Method 300 also includes determining 312 a size and spacing for perforations defined within device 148 that provide the predetermined air flow from step 308 that is substantially similar to step 310.

Method 300 further includes determining 314 a pressure that is needed within plenum 144 to attain the predetermined air flows of steps 306 and 308. Determining 314 such pressure needed in plenum 144 is performed using algorithms known in the art. Moreover, in operation, such pressures are sensed and measured using pressure transmitters 212.

A method of cooling high-density racks 104 and low-density racks 106 is provided. The method includes providing an air handling sub-system 110. The method also includes channeling at least a portion of air towards racks 104 and 106. The method further includes configuring control sub-system 200 to facilitate substantially maintaining at least a portion of air handling sub-system 110 at a predetermined pressure.

The apparatus and method described above facilitates reducing installation costs of system 100 by eliminating expensive components, for example, variable air volume (VAV) controllers, that are replaced by PLCs and VFDs that are typically off-the-shelf stock items. Moreover, such PLCs and VFDs configured in a relatively simple control scheme facilitates reduced post-installation maintenance costs. Furthermore, such configurations facilitate reduced operational costs due at least in part to reduced electrical power usage.

In operation and referring to FIG. 1, fan 114 takes suction on air from duct 118 as illustrated by arrows. Fan 114 discharges air through volute 122 and subsequently into compartment 126 wherein air passes over tubes 128 and is cooled. In the exemplary embodiment, the temperature of air discharged from compartment 126 is typically less than 10° C. (50° F.) such that some heat absorption by air during transit to plenum 144 is accounted for. Such air temperatures are at least partially determined via method 300. Cooled air is channeled into duct 130 wherein it may be further channeled to a data center (not shown) by duct 134 or channeled to duct 136. A secondary source of air, for example, outside air, may be channeled into duct 136 from 140 to provide make-up air for typical operational losses and facilitate maintaining the quality of air within data center 102 within predetermined parameters. Moreover, in an emergency, for example, when air-handler 112 is out of service, 100% of the cooling air needed to place data center 102 in a stable condition can be introduced into data center 102. Typically, during warmer periods, introduction of outside make-up air via duct 140 is substantially reduced to near zero to mitigate humidity of air within sub-system 110. Otherwise, during cooler periods, a make-up rate that provides approximately 10% of the air within sub-system 110 is used. In the event that make-up air temperature diverges from compartment 126 air discharge temperature, the temperature of air channeled from compartment 126 is adjusted appropriately as described below.

Air is channeled from duct 136 into plenum 144 such that a predetermined substantially static pressure is maintained within plenum 144. Such static pressure is determined via method 300 as described above. Air is then channeled upward from plenum 144 through devices 146 and 148, wherein devices 146 and 148 facilitate channeling predetermined air flows that impinge on racks 104 and 106. Such air flows and associated configurations of devices 146 and 148 are determined using method 300 as described above. In the exemplary embodiment, the temperature of air discharged from plenum 144 is approximately 10° C. (50° F.).

Air is subsequently channeled across and through racks 104 and 106 wherein the air absorbs at least some of the waste heat generated within racks 104 and 106. Warmed air is channeled upward from racks 104 and 106 through vents 154 into plenum 152, wherein the warmed air is at least partially mixed. Air is channeled from plenum 152 into duct 156, wherein duct 156 facilitates further mixing. The warmed air is subsequently channeled into duct 118 for another transit through sub-system 110 and/or channeled to another air handler via duct 162.

Also, in operation, chilled water pump 172 channels chilled water from heat exchanger 176 to tubes 128 within compartment 126 via flow control valve 174. Chilled water within tubes 128 absorbs heat from air being channeled through compartment 126 over tubes 128. Warmed water is subsequently channeled to heat exchanger 176 wherein heat is transferred from chilled water within tubes 178 into service water flowing around tubes 178. Service water is channeled from heat exchanger 176 to pump 184 wherein it is further channeled to flow control valve 182 via and back to heat exchanger 176.

Further, in operation, PLC 201 receives a plurality of temperature measurement signals from thermocouples 202, 204, 206 and 208. PLC 201 also receives a plurality of pressure measurement signals from pressure transmitters 210 and 212.

In the exemplary embodiment, an independent rack differential temperature control scheme and an independent inlet plenum pressure control scheme (neither shown) are configured within PLC 201. The differential temperature control scheme and the inlet plenum pressure control scheme have no direct co-dependencies that include, but are not limited to, feed forward features. Separating the two control schemes facilitates mitigating conflicting control actions from forming instabilities within system 100. Alternatively, the differential temperature and the inlet plenum pressure control schemes are directly interfaced to each other such that control of one directly affects the control of the other.

In operation, the differential temperature control scheme configured within PLC 201 facilitates receipt of cool air temperature measurement signals from thermocouples 204 and warm air temperature measurement signals from thermocouples 206. The scheme also facilitates determining a differential temperature based on the measurement signals from thermocouples 206 and 204 via at least one algorithm. In the exemplary embodiment, the differential temperature is controlled to approximately 22.2° C. (40° F.) and the inlet plenum air temperature is controlled to approximately 10° C. (50° F.). Therefore, the outlet plenum temperature is controlled to approximately 32.2° C. (90° F.). To maintain these temperatures and differential temperature, in the exemplary embodiment, chilled water temperature at an inlet to tubes 128 is maintained at approximately 5.6° C. (42° F.).

In the exemplary embodiment, in the event that the differential temperature across racks 104 and 106 increases beyond 22.2° C. (40° F.), PLC 201 issues a command signal via the differential temperature control scheme to VFD 216 to increase a speed of the prime mover driving pump 172. Alternatively, PLC 201 issues a command signal via the differential temperature control scheme to valve 174 to move in the open direction. The increased speed of pump 172 and revised valve 174 position are determined via at least one algorithm configured within PLC 201. Chilled water flow is increased through tubes 128, thereby increasing the rate of heat removal from air within compartment 126 and subsequently decreasing the temperature of air transiting to plenum 144 via ducts 130 and 136. PLC 201 will modulate VFD 216 and/or valve 174 position as necessary to return the differential temperature across racks 104 and 106 to a static approximately 22.2° C. (40° F.). Furthermore, the additional heat loading of chilled water sub-system 170 is controlled as well by accelerating pump 184 via signals received by VFD 218 from PLC 201 and/or opening valve 182 via signals received from PLC 201 such that a chilled water temperature of approximately 5.6° C. (42° F.) at an inlet to tubes 128 is maintained.

Also, in the exemplary embodiment, in the event that the static pressure of plenum 144 as sensed and measured by transmitters 212 decreases below the predetermined value, PLC 201 via the pressure control scheme receives the pressure measurement signals and uses at least one algorithm determine a revised speed of fan 114. PLC 201 issues a command signal via the pressure control scheme to VFD 214 to increase a speed of the prime mover driving fan 114. PLC 201 will modulate VFD 214 as necessary to return the pressure within plenum 144 to the static predetermined value.

The method and apparatus for cooling electronic components as described herein facilitates reducing costs of a data center cooling system. Specifically, replacing relatively high-cost components with low-cost components facilitates reducing installation costs. Moreover, replacing relatively fragile components with field-rugged components facilitates reducing maintenance and replacement costs. Furthermore, using a static control scheme facilitates reducing operating costs.

Exemplary embodiments of cooling systems as associated with data centers are described above in detail. The methods, apparatus and systems are not limited to the specific embodiments described herein nor to the specific illustrated cooling systems and data centers.

While the invention has been described in terms of various specific embodiments, those skilled in the art will recognize that the invention can be practiced with modification within the spirit and scope of the claims.

What is claimed is:

1. A method of cooling at least one electronic component, the at least one electronic component configured to generate a predetermined waste heat, said method comprising:
   providing a first fluid channeling sub-system that has a first fluid, a first fluid source, and a second fluid source;
   providing a second fluid channeling sub-system that has a second fluid, the second fluid channeling sub-system coupled in heat transfer communication with the first fluid channeling sub-system at a heat exchange compartment;
   providing at least one controller;
   channeling at least a portion of the first fluid towards the electronic component, wherein the first fluid is selectively channeled to bypass the heat exchange compartment; and
   configuring the at least one controller to facilitate substantially maintaining at least a portion of the first fluid channeling sub-system at a predetermined pressure by channeling the first fluid from at least one of the first fluid source and the second fluid source.

2. A method in accordance with claim 1, said method further comprising:
   providing at least one fluid flow restriction device coupled in flow communication with the first fluid source, wherein the at least one fluid flow restriction device is configured to selectively restrict the first fluid from at least one of the first fluid source and the second fluid source;
   controlling a flow of the first fluid via the controller such that a first fluid differential temperature across the electronic component is substantially maintained at a predetermined value;
   configuring the second fluid channeling sub-system such that the first and second fluid channeling sub-systems are in heat transfer communication with each other, wherein the first fluid from the first fluid source transfers heat to the second fluid;
   providing at least one sensor in flow communication with at least a portion of at least one of the second fluid and the first fluid; and
   coupling the at least one controller in electronic data communication to the at least one sensor.

3. A method in accordance with claim 2 wherein controlling a flow of the first fluid such that a first fluid differential temperature across the at least electronic component is substantially maintained at a predetermined value comprises:
   determining the first fluid differential temperature value;
   determining a first fluid flow that substantially facilitates providing the first fluid differential temperature value;
   configuring the at least one controller to facilitate substantially delivering a predetermined first fluid flow; and
   configuring the controller to facilitate substantially maintaining a temperature of the second fluid substantially at a predetermined value.

4. A method in accordance with claim 3, wherein configuring the controller to facilitate substantially maintaining a temperature of the second fluid at a predetermined value comprises:
  determining a second fluid temperature value that facilitates substantially controlling the first fluid differential temperature to the predetermined value;
  providing a third fluid channeling sub-system that has a third fluid;
  configuring the third fluid channeling sub-system such that the second and third fluid channeling sub-systems are in heat transfer communication with each other, wherein the second fluid transfers heat to the third fluid; and
  controlling at least one characteristic of the second fluid.

5. A method in accordance with claim 3 wherein configuring the at least one controller to facilitate substantially delivering a predetermined first fluid flow comprises:
  determining at least one of a number of, positioning of, and dimensions of openings formed within the at least one fluid flow restriction device that facilitates substantially providing the predetermined first fluid flow;
  configuring the at least one fluid flow restriction device to at least restrict the first fluid from the first fluid source while facilitating channeling the first fluid from the second fluid source; and
  determining a pressure of the first fluid that facilitates substantially providing the predetermined first fluid flow.

6. A method in accordance with claim 3 wherein configuring the at least one controller to facilitate substantially delivering a predetermined first fluid flow comprises determining a plurality of differing predetermined first fluid flows for each of a plurality of differing electronic components.

7. A method in accordance with claim 6 wherein determining a plurality of differing predetermined first fluid flows for each of a plurality of differing electronic components comprises integrating the plurality of differing predetermined flows into a total first fluid flow.

8. A cooling system comprising:
  a first fluid channeling sub-system that has a first fluid, a first fluid source, and a second fluid source;
  a second fluid channeling sub-system that has a second fluid, said second fluid channeling sub-system coupled in heat transfer communication with said first fluid channeling sub-system at a heat exchange compartment, said second fluid channeling sub-system configured to remove heat from the first fluid at the heat exchange compartment;
  at least one pressure sensor coupled in flow communication with at least a portion of at least one of the first fluid and the second fluid;
  at least one controller coupled in electronic data communication with said at least one pressure sensor, said at least one controller configured to control a predetermined differential temperature across at least a portion of said first fluid channeling sub-system by controlling a temperature of at least a portion of the second fluid based on an output of said at least one pressure sensor, said at least one controller further configured to facilitate selectively channeling the first fluid from at least one of the first fluid source and the second fluid source to bypass the heat exchange compartment.

9. A cooling system in accordance with claim 8 wherein said controller is further configured to control a predetermined pressure within at least a portion of the first fluid system.

10. A cooling system in accordance with claim 9 wherein said predetermined pressure is substantially static.

11. A cooling system in accordance with claim 8 further comprising at least one fluid flow restriction device configured to selectively restrict the first fluid from at least one of the first fluid source and the second fluid source, wherein said fluid flow restriction device is in flow communication with a first fluid source and further configured to facilitate controlling said differential temperature and said pressure of at least a portion of the first fluid by selectively operating the at least one fluid restriction device to at least restrict the first fluid from the first fluid source while facilitating channeling the first fluid from the second fluid source.

12. A cooling system in accordance with claim 11 wherein said at least one fluid flow restriction device comprises a predetermined number of openings having predetermined dimensions, said at least one fluid flow restriction device having said openings formed at predetermined positions, wherein said openings, said dimensions and said positions are determined empirically, wherein said openings are configured to facilitate a predetermined first fluid flow rate, wherein said at least one fluid flow restriction device comprises at least one of:
  a grating; and
  a perforated tile.

13. A cooling system in accordance with claim 12 wherein said at least one fluid flow restriction device comprises a plurality of fluid flow restriction devices, wherein each of said plurality of fluid flow restriction devices is configured for at least one of:
  a first electronic component rack having a first waste heat generation; and
  a second electronic component rack having a second waste heat generation, wherein the first waste heat generation is greater than the second waste heat generation.

14. A cooling system in accordance with claim 8 further comprising a third fluid channeling sub-system that has a third fluid, said third fluid channeling sub-system coupled in heat transfer communication with said second fluid channeling sub-system, said third fluid channeling sub-system configured to remove heat from the second fluid.

15. A cooling system in accordance with claim 14 wherein said controller is further configured to control a temperature of at least a portion of the second fluid via controlling at least one characteristic of the third fluid.

16. A data center comprising:
  at least one equipment enclosure partially defined by at least one wall, one ceiling and one floor;
  at least one electronic component rack positioned within said at least one equipment enclosure;
  at least one cooling system coupled in flow communication with said at least one equipment enclosure, said at least one cooling system comprising a first fluid channeling sub-system and a second fluid channeling sub-system, said first fluid channeling sub-system having a first fluid, a first fluid source, and a second fluid source, said second fluid channeling sub-system having a second fluid, said second fluid channeling sub-system coupled in heat transfer communication with said first fluid channeling sub-system at a heat exchange compartment, at least one pressure sensor coupled in flow communication with at least a portion of at least one of the first fluid and the second fluid, at least one controller coupled in electronic data communication with said at least one pressure sensor, said first fluid in flow communication with said at least one electronic component rack, said second fluid channeling sub-system configured to remove heat from the first fluid at the heat exchange compartment, said at least one controller configured to control a predetermined differential temperature across at least a portion of said first fluid channeling sub-system by controlling a temperature of at least a portion of the second fluid based on an output of said at least one pressure sensor, said at least one controller further configured to facilitate selectively channeling the first fluid from at least one of the first fluid source and the second fluid source to bypass the heat exchange compartment.

17. A data center in accordance with claim 16, wherein said controller is further configured to control a predetermined pressure within at least a portion of the first fluid system.

18. A data center in accordance with claim 17 wherein said predetermined pressure is substantially static.

19. A data center in accordance with claim 17, wherein said at least one sensor comprises a plurality of pressure sensors configured to measure and facilitate control of said predetermined pressure.

20. A data center in accordance with claim 16 further comprising at least one fluid flow restriction device configured to selectively restrict the first fluid from at least one of the first fluid source and the second fluid source, wherein said fluid flow restriction device is in flow communication with a first fluid source and further configured to facilitate controlling said differential temperature and said pressure of at least a portion of the first fluid by selectively operating the at least one fluid restriction device to at least restrict the first fluid from the first fluid source while facilitating channeling the first fluid from the second fluid source.

21. A data center in accordance with claim 20 wherein said at least one fluid flow restriction device comprises a predetermined number of openings having predetermined dimensions, said at least one fluid flow restriction device having said openings formed at predetermined positions, wherein said openings, said dimensions and said positions are determined empirically, wherein said openings are configured to facilitate a predetermined first fluid flow rate, wherein said at least one fluid flow restriction device comprises at least one of:

a grating; and a perforated tile.

22. A data center in accordance with claim 21 wherein said at least one fluid flow restriction device comprises a plurality of fluid flow restriction devices, wherein each of said plurality of fluid flow restriction devices is configured for at least one of:

a first electronic component rack having a first waste heat generation; and a second electronic component rack having a second waste heat generation, wherein the first waste heat generation is greater than the second waste heat generation.

23. A data center in accordance with claim 16 further comprising a third fluid channeling sub-system that has a third fluid, said third fluid channeling sub-system coupled in heat transfer communication with said second fluid channeling sub-system, said third fluid channeling sub-system configured to remove heat from the second fluid.

24. A data center in accordance with claim 23 wherein said controller is further configured to control a temperature of at least a portion of the second fluid via controlling at least one characteristic of the third fluid.

* * * * *